United States Patent [19]

Ono et al.

[11] 4,010,032
[45] Mar. 1, 1977

[54] PROCESS FOR PRODUCING COLOR SEPARATION RECORD UTILIZING ELECTROLUMINESCENT MATERIAL

[76] Inventors: Yoshio Ono, No. 25-2, Nishirendaino-cho, Murasakino, Kita, Kyoto; Takashi Sakamoto, No. 16, Sagasono-cho, Narutaki, Ukyo, Kyoto, both of Japan

[22] Filed: Mar. 31, 1975

[21] Appl. No.: 563,647

[52] U.S. Cl. .................................. 96/31; 96/24; 96/30; 96/45.1
[51] Int. Cl.² ................. G03C 7/00; G03F 1/00; G03C 1/92
[58] Field of Search ............... 96/45.1, 30, 31, 32, 96/24

[56] References Cited

UNITED STATES PATENTS

| | | | |
|---|---|---|---|
| 2,883,556 | 4/1959 | Jenny et al. | 96/45.1 |
| 2,971,841 | 2/1961 | Moore | 96/30 |
| 3,591,283 | 7/1971 | Peisach | 96/45.1 |
| 3,600,172 | 8/1971 | Land | 96/45.1 |
| 3,615,441 | 10/1971 | Deneau | 96/30 |

Primary Examiner—David Klein
Assistant Examiner—Richard L. Schilling
Attorney, Agent, or Firm—Spensley, Horn & Lubitz

[57] ABSTRACT

A photosensitive material such as photographic film is exposed with a color image through a color separation filter. An electroluminescent plate is placed over the film and exposed with the color image first through the color separation filter with the plate charged to one electrical polarity and again through a color and contrast compensating filter with the plate charged to the opposite polarity. A high electrical potential is applied to the electroluminescent plate causing the plate to radiate a luminescent image onto the film as a color and contrast compensation exposure.

4 Claims, 7 Drawing Figures

PROCESS FOR PRODUCING COLOR SEPARATION RECORD UTILIZING ELECTROLUMINESCENT MATERIAL

The present invention relates to a process for producing a color separation record for color printing utilizing an electroluminescent material. A conventional color printing process involves preparing printers for printing using printing inks of three primary colors such as cyan, magenta and yellow in addition to black. The printers are made utilizing color separation records in the form of photographic films for the respective ink colors. A problem in such a conventional printing process is the poor spectrum reflection characteristics of printing inks. In order to faithfully reproduce a color image, it is necessary to provide color compensation in the preparation of the color separation records to correct for the poor spectrum reflection characteristics of the printing inks. It is also desirable in order to provide good gray scale characteristics in the printing process to provide contrast compensation whereby the highlights, shadow portions and the like can be selectively adjusted to desired shades of gray.

Various methods are known in the prior art to achieve such contrast and color compensation. The most common method involves photographically preparing masks which are placed between the color image projector and the color separation record film during the exposure of the film. A major drawback of this method is that the mask absorbs a good deal light. The transmission through the mask may be as low as 20% in the highlight areas in some applications. Another drawback is that a mask must be prepared for each of the printing ink colors, thereby making the process expensive. Although a color film has been developed which is usable for all of the colors, it is more expensive than the conventional film and also contributes to an expensive process.

Another prior art process involves direct screening in which the color image is projected onto the film through a color compensating filter, a screen and in some cases other elements in addition to the mask. Light absorption by the mask is especially a drawback in this process.

Another prior art process for providing the required color compensation involves the use of an electronic computor. Although color and contrast compensation can be performed easily over wide ranges, the computor scans the color original in a pattern of discrete bits, which must be large in number to produce a high quality image. Such scanning necessarily requires a long period of time. Another drawback is that such a complicated computor is expensive to manufacture.

It is, therefore, an object of the present invention to provide an inexpensive process for producing a color separation record of high quality in a short period of time.

It is another object of the present invention to provide a process for producing a color separation record utilizing an electroluminescent plate.

It is another object of the present invention to provide a process for producing a color separation record utilization a reusable material.

The above and other objects, features and advantages of the present invention will become more apparent from the following description when taken in conjunction with the accompanying drawings, in which.

Figure 1:
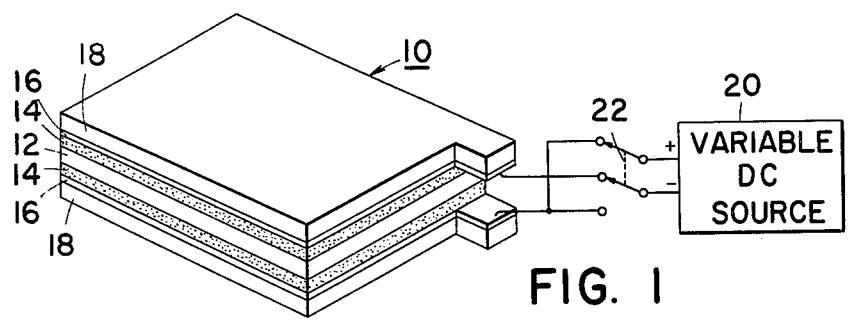
FIG. 1 is a perspective view of an electroluminescent plate utilized in the process of the present invention.

Referring now to FIG. 1, an electroluminescent plate 10 utilized in carrying out the present invention comprises a layer 12 of electroluminescent material. Dielectric layers 14 of, for example, yttrium oxide ($Y_2O_3$), are formed on the opposite sides of the electroluminescent layer 12. Nesa electrodes 16 are formed on the dielectric layers 14 and transparent glass plates 18 are provided covering the nesa electrodes 16. A variable voltage source of direct current electrical potential 20 is provided, and the positive and negative terminals thereof are connectable through a polarity changeover switch 22 to the nesa electrodes 16.

Figure 6:
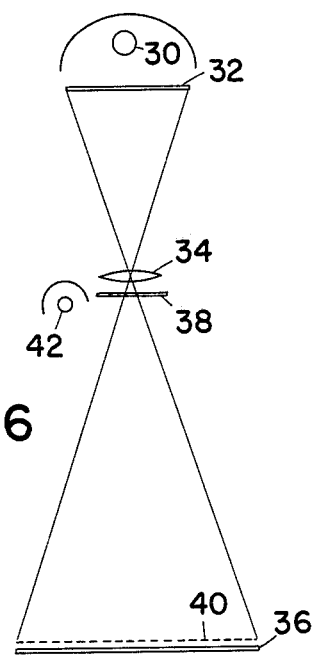
FIGS. 6 and 7 are schematic views of apparatus performing the steps of the process according to the present invention.

Referring now to FIG. 6, a light source 30 is disposed above a color transparency formed with a color image. A lens 34 is arranged below the transparency 32 to project or radiate an image thereof onto a photosensitive color separation record film 36 through a color separation filter 38 and a resolving screen 40. The screen 40 and a flashing light source 42 or optional. The first step of the process comprises imaging the film 36 in this manner. The color separation filters for the various printing ink colors are preferably red (wratten No. 25) for cyan ink, green (wratten No. 58) for magenta ink, violet (wratten No. 47B) for yellow ink and orange (wratten No. 85) for black ink.

Figure 2:
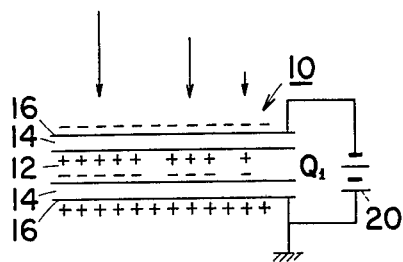
FIGS. 2 to 5 are graphic illustrations of the steps of the process.
Figure 7:
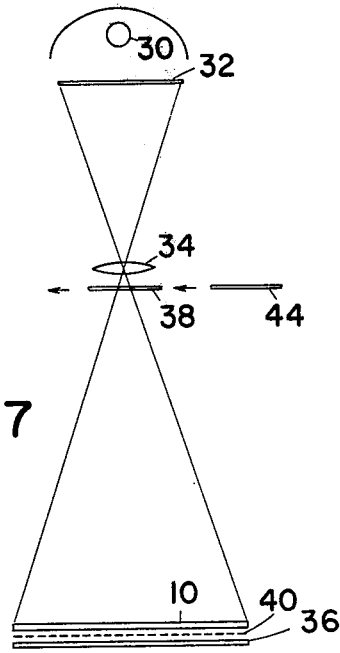

In the second step of the process, the plate 10 is placed on the film 36 and imaged through the filter 38 as shown in FIG. 7. Referring also to FIG. 2, arrows represent the light incident on the plate 10. The source 20 is connected to the nesa electrodes 16 so that a negative potential is applied to the upper area nesa electrode 16 and a positive potential is applied to the lower nesa electrode 16. A layer of negative ions is formed on the upper surface of the upper nesa electrode 16 whereas a layer of positive ions is formed on the bottom surface of the lower electrode 16 is designated by + and − signs. In the irradiated areas of the plate 10, internal polarization is produced in the electroluminescent layer 12 so that positive charge carriers migrate to the interface of the electroluminescent layer 12 and the upper dielectric layer 14 and negative charge carriers migrate to the interface of the electroluminescent layer 12 and the lower dielectric layer 14. The internal polarization charge potential in the layer 12 has a magnitude of $Q_1$.

In the next step of the process, the color separation filter 38 is replaced by a color and contrast compensating filter 44 and the plate 10 is imaged through the filter 44. The filter 44 for the various ink colors are preferably a red filter which slightly transmits green (wratten No. 85B) for cyan and black inks, a red filter which slightly transmits blue (wratten No. 25 and 47B at a ratio of 3:1) for magenta ink and a green filter (wratten No. 58) for yellow ink. The exposure ratio through the filters 38 and 44 is approximately 6:4.

Figure 3:
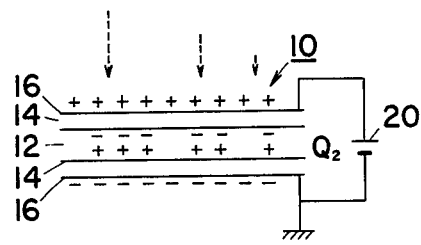
Figure 4:
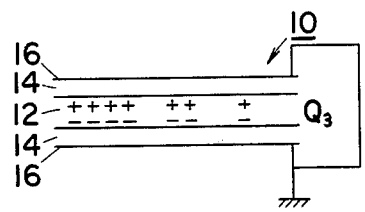

During the exposure of the plate 10 through the filter 44 as shown in FIG. 3, the polarity of the source 20 is reversed and the magnitude of the applied potential is reduced to a suitable degree. The positive terminal of the source 20 is connected to the upper nesa electrode 16 to apply a layer of positive ions thereon. The negative terminal of the source 20 is connected to the lower nesa electrode 16 to apply a layer of negative ions thereon. In the irradiated areas of the plate 10, negative and positive charge carriers migrate to the interfaces of the electroluminescent layer 12 and the upper and lower dielectric layers 14 to create a charge potential $Q_2$. The effects of the charge potential $Q_1$ are not illustrated in FIG. 3. The resulting charge potential is designated as $Q_3$ and is equal to $Q_1-Q_2$ as shown in FIG. 4. Both of the nesa electrodes 16 are grounded to store the electrostatic image in the plate 10. The materials of the plate 10 are selected to have high persistent internal polarization characteristics so that the image may be stored for a required period of time, preferably with the plate 10 in a dark place.

Figure 5:
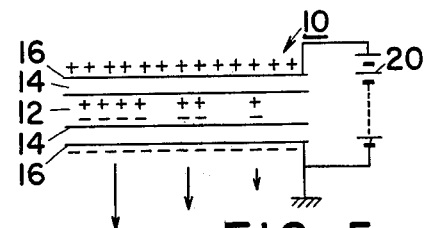

In the final step of the process illustrated in FIG. 5, the source 20 is connected to the plate 10 to apply a high potential thereto with the positive terminal of the source 20 connected to the upper nesa electrode 16 and the negative terminal of the source 20 connected to the lower nesa electrode 16. The applied potential is sufficient to cause the plate 10 to radiate an electroluminescent image onto the film 36 as shown by arrows in FIG. 5. In this manner, color and contrast compensation is accomplished by an additional exposure of the film 36 by the plate 10 rather than the light source 30 through the transparency 38 and a color and contrast compensating filter as in the prior art. The exposure time is greatly reduced by the process of the present invention, and the plate 10 can be discharged and re-used repeatedly.

While the present invention has been particularly shown and described with reference to the preferred example thereof, it will be understood by those skilled in the art that various changes may be made without departing from the spirit and scope of the present invention. For example, the steps of the process of the present invention may be performed in various ways other than that has been described hereinabove. The process of the present invention may be utilized where the color separation is performed by using a tight printer.

What is claimed is:

1. A process for producing a color separation record for color printing comprising the ordered steps of:
   radiating a color image onto a photosensitive material through a color separation filter;
   placing an electroluminescent member onto said photosensitive material;
   applying an electrical potential to the electroluminescent member of a given magnitude and a predetermined polarity;
   radiating said color image onto said electroluminescent member and said photosensitive material through the color separation filter;
   reversing the polarity of and lowering the value of the electrical potential applied to the electroluminescent member;
   radiating the color image onto said electroluminescent member through a color compensating filter; and
   increasing the magnitude of the electrical potential applied to the electroluminescent member to radiate the luminescent image thereof onto the photosensitive material in alignment with the color image.

2. A process for producing a color separation record for color printing according to claim 1 wherein said step of radiating a color image onto a photosensitive material through a color separation filter comprise:
   shining light through a color transparency having a color image thereon; and focusing light passing through said color transparency with a lens through said color separation filter onto said photosensitive material.

3. A process for producing a color separation record for color printing according to claim 1 wherein said step of radiating a color image onto the electroluminescent member and said photosensitive material through a color separation filter, comprise:
   shining a light through said color transparency; and focusing light passing through said color transparency with a lens through said color separation filter onto said electroluminescent member and said photosensitive material.

4. A process for producing a color separation record for color printing according to claim 3 wherein said step of radiating the color image onto an electroluminescent member through a compensating filter comprises:
   shining a light through said color transparency; and focusing light passing through said color transparency with a lens through said compensating filter onto said electroluminescent member.

* * * * *